United States Patent [19]

Pezzani

[11] Patent Number: 5,627,711

[45] Date of Patent: May 6, 1997

[54] SELF-PROTECTED SEMICONDUCTOR PROTECTION COMPONENT

[75] Inventor: Robert Pezzani, Vouvray, France

[73] Assignee: SGS-Thomson Microelectronics S.A., Saint Genis Pouilly, France

[21] Appl. No.: 384,632

[22] Filed: Feb. 6, 1995

Related U.S. Application Data

[63] Continuation of Ser. No. 10,272, Jan. 28, 1993, abandoned.

[30] Foreign Application Priority Data

Jan. 29, 1992 [FR] France .................................. 92 01245

[51] Int. Cl.[6] .................................................. H02H 9/04
[52] U.S. Cl. ............................ 361/56; 361/111; 361/119
[58] Field of Search ........................... 257/908, 918, 257/921, 923, 355, 365, 367, 419, 665; 361/54–57, 86–88, 91, 93, 100, 101, 103, 104, 111, 119

[56] References Cited

U.S. PATENT DOCUMENTS

| | | | |
|---|---|---|---|
| 4,742,425 | 5/1988 | Conzelmann et al. | 361/104 |
| 4,875,130 | 10/1989 | Huard | 361/56 |
| 4,908,692 | 3/1990 | Kikuchi et al. | 257/419 |
| 4,945,398 | 7/1990 | Kurita et al. | 257/665 |

FOREIGN PATENT DOCUMENTS 0349490  5/1989  European Pat. Off. .

OTHER PUBLICATIONS

IEEE Journal of Solid–State Circuits, vol. SC–8, No. 6, Dec., 1973, pp. 419–427 W.F. Davis, "Bipolar Design Considerations for the Automotive Environment".
Patent Abstracts of Japan, vol. 14, No. 580 (E–1017) 25 Dec. 1990 & JP–A–22 53 651 (NEC) 12 Oct. 1990.

Primary Examiner—Jeffrey A. Gaffin
Assistant Examiner—Ronald W. Leja
Attorney, Agent, or Firm—David M. Driscoll; James H. Morris

[57] ABSTRACT

A monolithic protection semiconductor component is connected between a first semiconductor region apparent on a first surface of a semiconductor chip and a second semiconductor region apparent on a second surface. The first region is divided into several non-overlapping areas. Each area is connected to a common electrode through a fuse such as a gold filament.

26 Claims, 2 Drawing Sheets

SELF-PROTECTED SEMICONDUCTOR PROTECTION COMPONENT

This application is a continuation of application Ser. No. 08/010.272. filed Jan. 28. 1993 now abandoned.

BACKGROUND OF THE INVENTION

1. Field of the Invention

The present invention relates to semiconductor protection components. realized in monolithic form. Such protection components are intended to clip a voltage applied to their terminals when this voltage exceeds a predetermined threshold. During the clipping phase, the voltage across the component is maintained at the predetermined threshold when the component is of the avalanche diode type or drops to a practically zero value when the protection component is a four-layer component of the break over type, such as a gateless triac.

2. Discussion of the Related Art

In FIG. 1 a protection component 1 is conventionally parallel connected to a line between a supply source 2 and supply input terminals 3 and 4 of a circuit 5 to be protected.

As indicated above. such components can be realized in various ways. FIG. 2 shows a structure of an avalanche diode formed on an N-type semiconductor substrate 10. The front surface area of this substrate includes a P-type region 11 and the rear surface area an N-type overdoped region 12. The upper surface of the substrate is coated with an isolating layer 13. usually silicon oxide. which serves to delineate the area where region 11 is formed. The upper surface is coated with a metallization 15 contacting region 11.

Conventionally. the lower surface of the substrate is mounted on a base 16 serving as a heat sink. by means of a solder preform 17 and metallization 15 is directly welded to a connection "nail".

A protection component as illustrated in FIG. 2 is intended to absorb overcurrents or overvoltages between metallization 15 and base 16. The size of this component is devised so as to absorb an overload up to a predetermined energy limit. However, there always exists an over-current level liable to destroy the component. Usually, such a destruction results from the occurrence of a shorting region 18 between the upper and lower metallizations. Then, once overvoltage is over, the component remains shorted and, in the case of a circuit such as shown in FIG. 1, circuit 5 is no longer fed between its terminals 3 and 4 because the source 2 is shorted. This situation constitutes a double drawback. To set circuit 5 into operation again, it is necessary to disconnect component 1 and, if it is desired to protect the circuit, component 1 must be replaced by a new component. This operation is always critical and, in some applications, such as for circuits used in satellites, requires the provision of a double amount of components and switching circuits that adversely affect the protection function quality.

To solve this problem, the practice is to use over-sized protection components capable of absorbing high overvoltages which are very unlikely to occur.

SUMMARY OF THE INVENTION

An object of the present invention is to provide a monolithic semiconductor protection component that remains operational even after the occurrence of a normally destroying overvoltage.

To achieve this object and others, the invention provides a monolithic semiconductor protection component connected between a first semiconductor region disposed on a first surface of a semiconductor chip and a second semiconductor region disposed on a second surface. The first region is divided into several non-overlapping areas. Each area is connected to a common electrode through a fuse.

According to an embodiment of the invention. each fuse is sized so as to open under normal supply conditions of the circuit to which the component is connected, when a shorting occurs between the area corresponding to the fuse and the second region.

According to an embodiment of the invention. each fuse is made of a gold filament.

According to an embodiment of the invention. each fuse is made of a metallization.

According to an embodiment of the invention. the protection component is an avalanche diode. The first region is a region of the first conductivity type formed in a first surface of a substrate of the second conductivity type, and the second region is a region of the second conductivity type formed in the second surface of the substrate.

According to an embodiment of the invention. the protection component includes two first regions, each of which forms a protection component between itself and the second region, and each first region is divided into non-overlapping areas. Each area of the first group of areas is connected by a fuse to a first electrode. Each area of the second group of areas is connected by a fuse to a second electrode.

In other words, the present invention provides a multi-cellular protection component such that, when a cell is destroyed by an overvoltage, a fuse associated with this cell is destroyed but the component continues operating due to the remaining good other cells.

The protection circuit according to the invention can be associated with an alarm detector which indicates that a very high overvoltage has occurred on the line to be protected. Then, it will be possible to change the component during a maintenance operation at a convenient time, the component being still operational and its associated circuit still operating. In case of a five-cell component, it can be assumed that the component will still be operative even if three overvoltages have destroyed three individual cells.

The foregoing and other objects, features, aspects and advantages of the invention will become apparent from the following detailed description of the present invention which should be read in conjunction with the accompanying drawings.

In the various drawings showing cross sectional views of semiconductor components, as is conventional in integrated circuit representation, the sizes of the various layers are not drawn to scale; more particularly, their thicknesses are arbitrarily enlarged to simplify drawings and to facilitate legibility of the figures. Those skilled in the art will be able to select the various thicknesses in order to obtain the desired characteristics.

DETAILED DESCRIPTION

Figure 2:
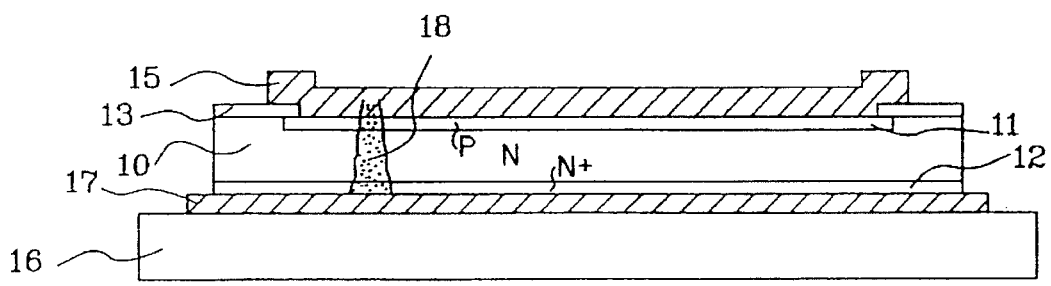
Figure 3A:
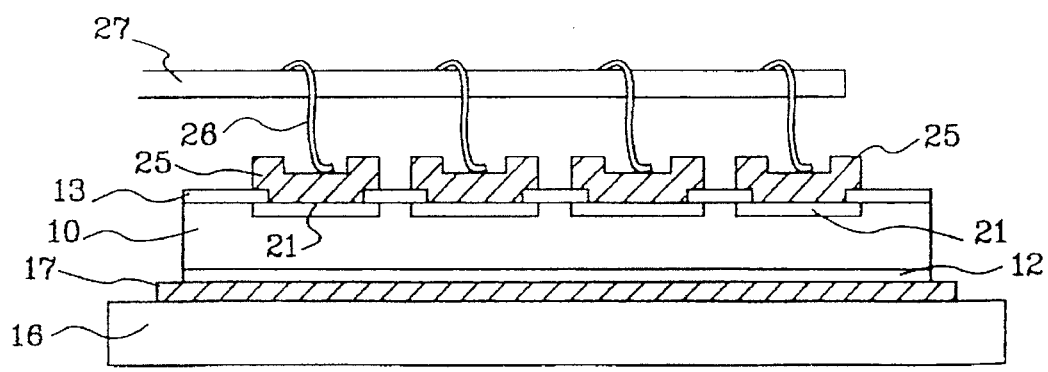
FIGS. 3A, 3B and 3C illustrate an embodiment of the present invention in three successive states, before the occurrence of a destroying overvoltage, during its occurrence, and shortly after the occurrence of the overvoltage.
Figure 3:
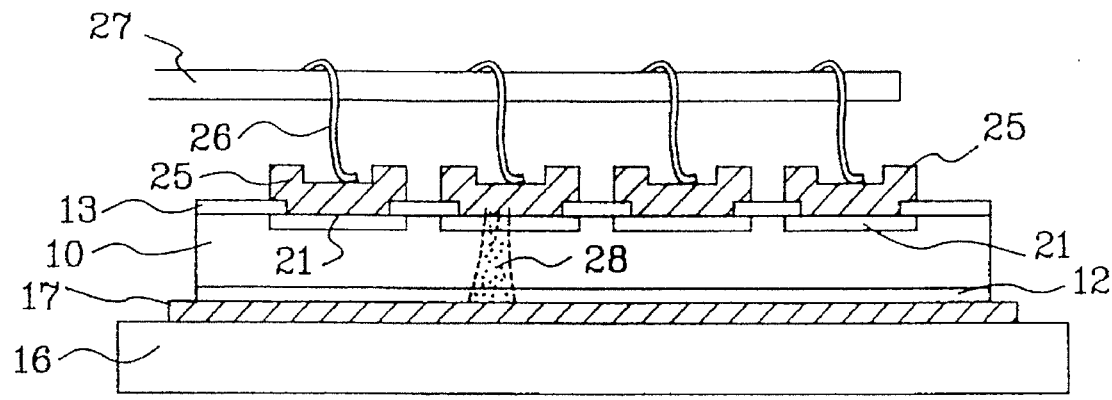
Figure 3:
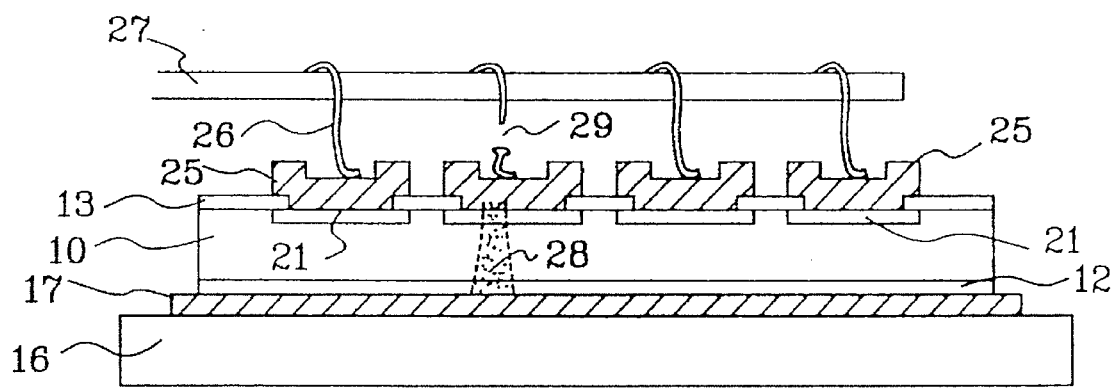

FIG. 3A shows a protection component of the same type as the component of FIG. 2, modified according to the invention. In these figures, the same elements are designated with the same reference numerals. According to the invention, the P-type region 11 is replaced with several non-overlapping P-type regions 21, each of which is coated with a metallization 25. Each metallization 25 is connected through a fuse 26 to an anode electrode 27. In the embodiment represented, the anode electrode 27 is a connecting lug and each fuse 26 is made of a gold filament, such as a filament of 50 µm in diameter. In practice, these filaments may also be of aluminum and are analogous to the filaments usually used to achieve contacts on metallizations of integrated circuit chips. Thus, under normal operation conditions, the structure of FIG. 3A is a multi-cellular structure (a four-diode structure in the embodiment represented) having the same behavior as the diode of FIG. 2.

In case of a normal overvoltage, the cells operate in avalanche mode in parallel. The energy is evenly distributed among the cells since the junctions are identical and have identical reverse characteristics due to their monolithic structure. The normal operation is therefore the same as for a conventional component.

Figure 1:
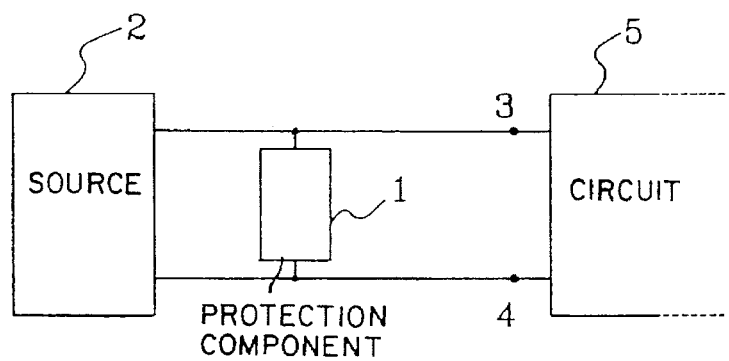
FIGS. 1 and 2. above described, are intended to illustrate the state of the art and the problem encountered.

In case of an excessive overvoltage, resulting in an overcurrent having a value higher than the current flow capacity of the chip, the shorting phenomenon described in relation with FIG. 2 will occur. However, with the structure according to the invention, as is illustrated in FIG. 3B, a shorting region 28 will occur on a single cell. Experiment has shown that this mode of destruction corresponds to the occurrence of a fuse channel in the chip between its upper and lower contacts, shorting the PN junction. This channel associated with a current focusing mechanism is limited to a few hundreds µm in diameter as soon as destruction occurs. Thus, a single cell will be destroyed, as shown by shorting region 28 in FIG. 3B. This destruction phenomenon is liable to occur very rapidly, in approximately a few tens of microseconds. Then, referring back to the mounting diagram of FIG. 1, the current from voltage source 2 flows through the protection component even after the end of the over-voltage. According to the invention, connection filaments 26 are chosen so as to melt under the influence of the source current. As illustrated in FIG. 3C, the whole shorted source current passes in one of the filaments serving as a fuse and the filament will melt and disconnect the damaged cell. Then, the component regains its initial characteristic (its protection function) but will include three parallel diodes only instead of four diodes. The only difference is that the excessive over-voltage values liable to destroy a cell of the component will be slightly lower when the component has the configuration of FIG. 3C than when it has the configuration of FIG. 3A.

Figure 4:
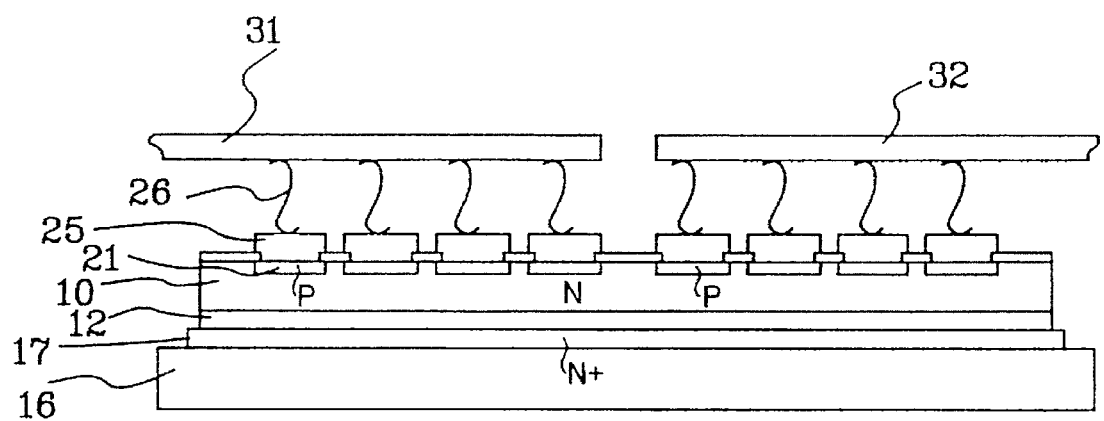
FIG. 4 shows another embodiment of the invention constituting a bidirectional protection component.

In the above description, an embodiment of the present invention has been described in relation with a unidirectional protection diode. The invention also applies to the realization of a bidirectional protection diode. FIG. 4 shows an exemplary embodiment of a bidirectional protection diode according to the invention. FIG. 4 again shows a multicellular diode in which half of the cells are connected to a first electrode 31 and the other half of the cells are connected to a second electrode 32. Base 16 no longer constitutes an electrode but simply a heat sink, and a rear surface conductor enabling current to flow in case of overvoltage between electrodes 31 and 32. For example, in case of a negative overvoltage on electrode 31, the diodes on the left part of FIG. 4 switch in the avalanche mode, and a current flows from electrode 31 to base 16, then from base 16 to electrode 32 through junctions PN which are forward biased in this case. In the same way as in the previous example (the unidirectional protection diode illustrated in FIGS. 3A-3C), in case of excessive overvoltage, one of the filaments 26 connected to electrode 31 or 32 will be destroyed.

The gold filaments 26 are sized so as to be destroyed once a shorting current has flowed during a long time duration with respect to the duration of an overvoltage pulse, such as approximately 10 milliseconds.

In a specific embodiment of the invention, comprising a monolithic chip including a couple of five diodes having avalanche voltages of 27 volts, the surface per diode being 1 mm$^2$, it can be appreciated that a diode can be destroyed by the occurrence of a 8/20 wave (that is, an overvoltage having a rise time of 8 microseconds and a fall time of 20 microseconds) and a 280-ampere intensity during a shock wave. Then, provided the gold filaments have a diameter of approximately 50 µm, the damaged diode is shorted due to melting of the gold filament by a 3.5-A current for approximately 10 milliseconds, when the supply voltage source has a voltage of approximately 15 V.

Various modifications can be made to the invention which has been described above in a specific embodiment.

In the foregoing, the described fuses 26 are formed by gold filaments connecting a metallized area to an electrode or lug. Those skilled in the art will be able to use materials other than gold to realize calibrated filaments. Additionally, each diode metallization can be connected to an electrode formed by a metal area deposited onto the semiconductor chip by means of a fuse formed on the chip, the fuse being constituted by any known technique, for example in the form of a thin metal deposit of the same material as the material forming the contacts or any other selected material.

The invention has been described above in the case where the protection component is a diode intended to operate in avalanche mode. Those skilled in the art will appreciate that other protection components lend themselves to a multicellular structure according to the invention. Indeed, in other protection components such as thyristors or gateless triacs, the destruction of a protection component corresponds to the shorting of a small area of the protection component.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A monolithic semiconductor protection component, to be disposed between and coupled to first and second inputs of a circuit to be protected, the first input receiving a supply voltage and being coupled to a common electrode of the protection component, the protection component comprising a first semiconductor region disposed at a first surface of a semiconductor substrate and a second semiconductor region disposed at a second surface of the semiconductor substrate, the first region being divided into more than one nonoverlapping substantially identical area and each nonoverlapping substantially identical area being connected to the common electrode by a respective fuse, wherein each nonoverlapping substantially identical areas provides redundant protection to said circuit to be protected, and when one of said nonoverlapping substantially identical area short circuits to said second semiconductor region, said respective fuse opens and separates said nonoverlapping substantially identical area from said supply voltage.

2. The component of claim 1, wherein each fuse is constructed to open under normal supply conditions of the circuit to be protected when a short occurs between the nonoverlapping area connected to the respective fuse and the second region.

3. The component of claim 1, wherein each fuse comprises a gold filament.

4. The component of claim 1, wherein each fuse comprises a metalization.

5. The component of claim 1, wherein each nonoverlapping area corresponds to an avalanche diode wherein the first region is a region of a first conductivity type formed at the first surface of the substrate of a second conductivity type and the second region is an overdoped region of the second conductivity type formed at the second surface of the substrate.

6. The component of claim 1, wherein the first region comprises two regions, wherein each said region of the two regions is divided into more than one nonoverlapping substantially identical area, each nonoverlapping substantially identical area of one of said two regions being connected to the common electrode by a respective fuse and each nonoverlapping identical area of another of said two regions being connected to a second electrode of the protection component by a respective fuse, the second electrode being coupled to the second input.

7. The component of claim 1, wherein each fuse is a metalization layer disposed on a surface of the semiconductor substrate.

8. The component of claim 1, wherein the supply voltage generates a source current, and each nonoverlapping area simultaneously conducts substantially a same amount of source current when providing protection, and when said one said nonoverlapping substantially identical area short circuits, the short circuited nonoverlapping substantially identical area conducts substantially all of the source current until the respective fuse opens, and the non-short circuited nonoverlapping substantially identical areas conduct substantially no current until the respective fuse opens, wherein the fuses are constructed to open only when conducting substantially all of the source current.

9. A monolithic semiconductor protection component, to be disposed between and coupled to first and second inputs of a circuit to be protected the first input receiving a supply voltage and being coupled to a common electrode of the protection component, said component comprising:

a plurality of avalanche diodes each having a substantially same breakdown threshold, disposed in parallel in a semiconductor substrate and coupled between the common electrode and a second electrode, to be coupled to the second input of the circuit to be protected; and a plurality of fuses, respectively coupling a first region of each avalanche diode in the plurality of avalanche diodes to the common electrode, each said avalanche diode providing redundant protection to said circuit to be protected, wherein when one of said avalanche diodes short circuits, the respective fuse associated with the one said avalanche diode opens and separates the one said avalanche diode from said supply voltage.

10. The component of claim 9, wherein each fuse is constructed to open under normal operating conditions of the circuit to be protected coupled to the component after a short occurs in the respective avalanche diode coupled to the respective fuse.

11. The component of claim 10, wherein each fuse comprises a gold filament.

12. The component of claim 10, wherein each fuse comprises a metalization.

13. The component of claim 9, wherein each avalanche diode comprises the first region of a first conductivity type formed at a first surface of the semiconductor substrate of a second conductivity type and a second region of an overdoped second conductivity type formed at a second surface of the substrate.

14. The component of claim 9, further comprising:

a second plurality of avalanche diodes, disposed in parallel and coupled between the second common electrode and a third common electrode; and a second plurality of fuses, respectively coupling a first region of each avalanche diode in the second plurality of avalanche diodes to the third common electrode to be coupled to the second input.

15. The component of claim 9, wherein each fuse is a metalization layer disposed on a surface of a semiconductor substrate.

16. The component of claim 9, wherein the supply voltage generates a source current, and each avalanche diode simultaneously conducts substantially a same amount of source current when an overvoltage greater than or equal to the breakdown threshold occurs, and when one said avalanche diode short circuits, the short circuited avalanche diode conducts substantially all of the source current until the respective fuse opens, and the non-short circuited avalanche diodes conduct substantially no current until the respective fuse opens, wherein the fuses are constructed to open only when conducting substantially all of the source current.

17. A monolithic protection component, to be disposed between and coupled to first and second inputs of a circuit to be protected the first input receiving a supply voltage and being coupled to a first electrode of the protection component, the protection component comprising:

a plurality of means, disposed in parallel between the first electrode and a second electrode and having a semiconductor construction, for clipping a voltage applied to the first electrode of the protection component to a predetermined value, wherein each means for clipping clips at a substantially same threshold voltage; and a plurality of fuses, respectively coupling a first region of each means for clipping in the plurality of means for clipping to the first electrode, each means for clipping providing redundant protection to said circuit to be protected, wherein when one of said means for clipping short circuits, the respective fuse opens and separates the one said means for clipping from said supply voltage.

18. The component of claim 17, wherein each fuse is constructed to open under normal operating conditions of the circuit to be protected after a short occurs in the respective means for clipping coupled to the fuse.

19. The component of claim 18, wherein each fuse comprises a gold filament.

20. The component of claim 18, wherein each fuse comprises a metalization.

21. The component of claim 17, wherein each means for clipping comprises the first region of a first conductivity type formed at a first surface of a semiconductor substrate of a second conductivity type and a second region of an overdoped second conductivity type formed at a second surface of the semiconductor substrate.

22. The component of claim 17, further comprising:

a second plurality of means, disposed in parallel between the second electrode and a third electrode and having semiconductor construction, for clipping the voltage applied to the protection component to a second predetermined value, wherein each second plurality of means for clipping clips at a substantially same threshold voltage; and a second plurality of fuses, wherein a respective fuse couples one of the second plurality of means for clipping to the third electrode to be coupled to the second input of the circuit to be protected.

23. The component of claim 22, wherein the plurality of means for clipping is coupled to the second plurality of means for clipping.

24. The component of claim 17, wherein each fuse is a metalization layer disposed on a surface of a substrate in which the plurality of means for clipping is formed.

25. The component of claim 17, wherein the supply voltage generates a source current, and each means for clipping simultaneously conducts substantially a same amount of source current when an overvoltage greater than or equal to the threshold voltage occurs, and when one said means for clipping short circuits, the short circuited means for clipping conducts substantially all of the source current until the respective fuse opens, and the non-short circuited means for clipping conduct substantially no current until the respective fuse opens, wherein the fuses are constructed to open only when conducting substantially all of the source current.

26. A monolithic component for protecting a circuit having first and second inputs, the first input coupled to a supply voltage that generates a source current, the component adapted to be coupled between the first and second inputs of the circuit, and comprising:

a substrate;

a plurality of overvoltage protection devices disposed in parallel and formed in the substrate and coupled between the first and second inputs, wherein each overvoltage protection device has substantially a same voltage breakdown threshold so that during an overvoltage greater than or equal to the voltage breakdown threshold each of the plurality of overvoltage protection devices simultaneously conducts substantially a same amount of source current; and a plurality of fuses, each fuse respectively coupling a first region of each of said plurality of overvoltage devices to the first input, wherein each fuse is constructed to open only when conducting substantially all of the source current when a respective overvoltage device associated with the one of the plurality of fuses short circuits, and being constructed to not open when said plurality of overvoltage protection devices are simultaneously conducting substantially the same amount of source current, wherein when one of the plurality of overvoltage protection devices short circuits, the one of the plurality of overvoltage devices that short circuits conducts substantially all of the source current and the overvoltage protection devices that are not short circuited conduct substantially no current until the respective fuse is opened.

* * * * *